(12) United States Patent
Sato (10) Patent No.: US 10,359,697 B2
(45) Date of Patent: Jul. 23, 2019

(54) IMPRINTING TEMPLATE SUBSTRATE, METHOD FOR MANUFACTURING THE SAME, IMPRINTING TEMPLATE SUBSTRATE MANUFACTURING APPARATUS, AND METHOD FOR MANUFACTURING SEMICONDUCTOR APPARATUS

(71) Applicant: TOSHIBA MEMORY CORPORATION, Tokyo (JP)

(72) Inventor: Nobuyoshi Sato, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 288 days.

(21) Appl. No.: 15/066,616

(22) Filed: Mar. 10, 2016

(65) Prior Publication Data
US 2017/0040161 A1      Feb. 9, 2017

(30) Foreign Application Priority Data

Aug. 4, 2015 (JP) .................................. 2015-154403

(51) Int. Cl.
G03F 7/00          (2006.01)
(52) U.S. Cl.
CPC .................................. *G03F 7/0002* (2013.01)
(58) Field of Classification Search
None
See application file for complete search history.

(56) References Cited

U.S. PATENT DOCUMENTS

| 6,446,933 B1 * | 9/2002 | Westmoreland | ........ B29C 33/56 106/38.27 |
| 6,523,803 B1 * | 2/2003 | Westmoreland | ........ B29C 33/56 106/38.22 |
| 6,544,466 B1 * | 4/2003 | Westmoreland | ........ B29C 33/56 257/E21.504 |
| 6,607,173 B2 * | 8/2003 | Westmoreland | ........ B29C 33/56 106/38.22 |

(Continued)

FOREIGN PATENT DOCUMENTS

| JP | 9-31215 | 2/1997 |
| JP | 2006-274322 | 10/2006 |

(Continued)

OTHER PUBLICATIONS

Okawa et al., JP 2014160754A, English Translation (Year: 2014).*

(Continued)

*Primary Examiner* — Jacob T Minskey
*Assistant Examiner* — Baileigh Kate Darnell
(74) *Attorney, Agent, or Firm* — Finnegan, Henderson, Farabow, Garrett & Dunner, L.L.P.

(57) ABSTRACT

An imprinting template substrate has a protruded portion, and a protective layer on a side surface of the protruded portion, and having a contact angle higher with respect to a resist material than a contact angle of the protruded portion with respect to the resist material. Even when the template is pressed to the resist, the resist hardly adheres to the side surface of the template. An imprinting process using the present template forms a pattern on a semiconductor substrate and then a semiconductor apparatus is manufactured.

9 Claims, 7 Drawing Sheets

(56) References Cited

U.S. PATENT DOCUMENTS

| | | | |
|---|---|---|---|
| 8,215,946 B2* | 7/2012 | GanapathiSubramanian | ............... B82Y 10/00 425/400 |
| 2002/0185584 A1* | 12/2002 | Westmoreland | ........ B29C 33/56 249/114.1 |
| 2008/0303187 A1 | 12/2008 | Stacey et al. | |
| 2009/0166317 A1* | 7/2009 | Okushima | .............. B82Y 10/00 216/11 |
| 2010/0264113 A1* | 10/2010 | Yoneda | .................. B82Y 10/00 216/41 |
| 2011/024413 | 10/2011 | Kawamura et al. | |

FOREIGN PATENT DOCUMENTS

| | | |
|---|---|---|
| JP | 2010-251601 | 11/2010 |
| JP | 2013-235885 | 11/2013 |
| JP | 2014-99525 | 5/2014 |
| JP | 2014-177072 | 9/2014 |

OTHER PUBLICATIONS

Sato et al., "Relationship between Surface Free Energy of Underlying Layers and $O_3$—TEOS Chemical Vapor Deposition", ECS Journal of Solid State Science and Technology, 2 (9) pp. N187-N190 (2013).

\* cited by examiner

IMPRINTING TEMPLATE SUBSTRATE, METHOD FOR MANUFACTURING THE SAME, IMPRINTING TEMPLATE SUBSTRATE MANUFACTURING APPARATUS, AND METHOD FOR MANUFACTURING SEMICONDUCTOR APPARATUS

CROSS REFERENCE TO RELATED APPLICATIONS

This application is based upon and claims the benefit of priority from the prior Japanese Patent Application No. 2015-154403, filed on Aug. 4, 2015, the entire contents of which are incorporated herein by reference.

FIELD

Embodiments of the present invention relates to an imprinting template substrate, a method for manufacturing the imprinting template substrate, an imprinting template substrate manufacturing apparatus, and a method for manufacturing a semiconductor apparatus.

BACKGROUND

An imprinting process has attracted attention as a technique for forming a fine pattern. In the imprinting process, an imprinting template including an uneven pattern formed thereon is contacted with resist coated on a base substrate. After the resist cures, the template is released from the resist so that a resist pattern is formed on the base substrate. The base substrate is processed with the resist pattern as a mask so that a fine pattern is formed.

In the imprinting process, it is assumed that processing for forming the resist pattern is repeated while the template is moved on a wafer.

The template is typically formed by processing quartz glass. More specifically, a protruded mesa portion is formed on the quartz glass. A fine uneven pattern is formed on an upper surface of the mesa portion. This uneven pattern is pressed to the resist. However, at a time point when the upper surface of the mesa portion of the template has been pressed to the resist, since the resist has flexibility, there is a risk that the resist extrudes from the mesa portion and climbs up a side surface of the mesa portion. The template is separated from the resist on the wafer after the resist has cured. However, the resist that has climbed up the side surface of the mesa portion, remains adhering to the side surface. Accordingly, when processing for pressing the template to the resist is repeated, the amount of the resist that adheres to the side surface of the mesa portion gradually increases. After a while, the resist falls on the wafer at unintended timing so as to cause a large defect on the wafer.

DETAILED DESCRIPTION

According to one embodiment, an imprinting template substrate has a protruded portion, and a protective layer on a side surface of the protruded portion, and having a contact angle higher with respect to a resist material than a contact angle of the protruded portion with respect to the resist material.

Embodiments of the present invention will be described below with reference to the drawings. An imprinting template substrate used in an imprinting process, a method for manufacturing the imprinting template substrate, an imprinting template substrate manufacturing apparatus, and a method for manufacturing a semiconductor apparatus, will be described below.

First Embodiment

Figure 1:
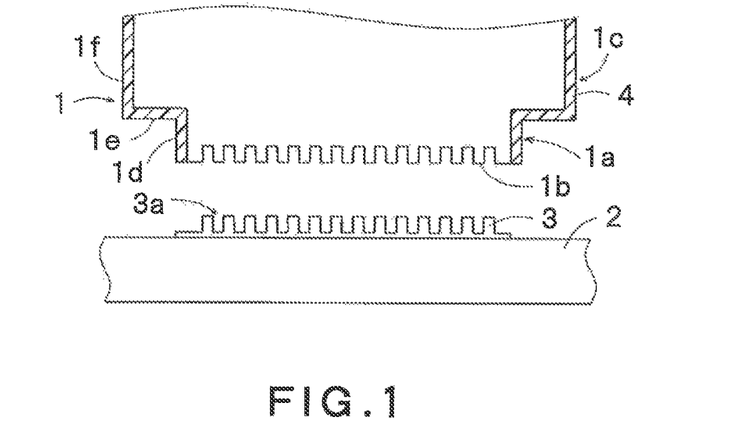
FIG. 1 is a cross-sectional view of an imprinting template according to a first embodiment.
Figure 2:
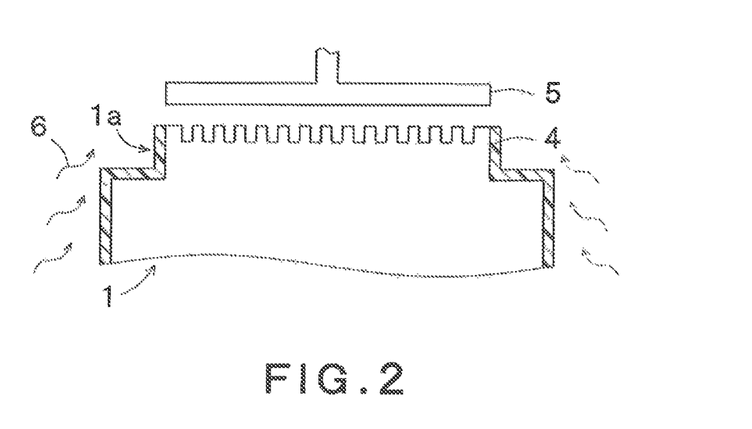
FIG. 2 is a view for describing a method for manufacturing the template illustrated in FIG. 1.

FIG. 1 is a cross-sectional view of an imprinting template 1 according to a first embodiment. FIG. 2 is a view for describing a method for manufacturing the template 1 illustrated in FIG. 1. According to the present embodiment, processing for forming a protective layer 4 on a side surface of the template 1 is performed in order to prevent resist 3 from climbing up the side surface of the template 1 when the template 1 is pressed to the resist 3 on a wafer 2. The protective layer 4 can be a film having a contact angle larger with respect to the resist 3 than that of a surface material (for example, quartz) of the template on which the protective layer 4 is formed (resist repellent layer).

As illustrated in FIG. 1, the imprinting template 1 according to the present embodiment includes a mesa portion (protruded pattern formed portion) 1a. A fine uneven pattern 1b is formed on an upper surface of the mesa portion 1a. The uneven pattern 1b is pressed to the resist 3 on the wafer 2 so that the uneven pattern 1b is transferred to the resist 3. Therefore, a resist pattern 3a is formed. A resist repellent layer 4 containing carbon and fluorine is formed on the side surface of the template 1 in order to prevent the resist 3 from climbing up and adhering to the side surface of the template 1 when the uneven pattern 1b of the template 1 is pressed to the resist 3 and the resist 3 extrudes. The resist repellent layer 4 is also formed on a side surface of a base portion 1c that supports the mesa portion 1a, in addition to the side surface of the mesa portion 1a. Note that, only forming the resist repellent layer 4 on the side surface of the mesa portion 1a can acquire the effect. The resist repellent layer 4 may be formed on the base portion 1c. More specifically, the base portion 1c includes a first surface 1e and a second surface 1f. The first surface 1e is coupled to the side surface of the mesa portion 1a and protrudes from the side surface 1d of the mesa portion 1a in a direction in which the first surface 1e and the side surface 1d intersect each other. The second surface 1f is coupled to the first surface 1e and protrudes from the first surface 1e in a direction in which the second surface 1f and the first surface 1e intersect each other. The resist repellent layer 4 is formed on both the first surface 1e and the second surface 1f. Accordingly, the resist repellent layer 4 is formed on the entire side surface of the template 1.

When the resist repellent layer 4 is formed on the side surface of the template 1, it is necessary to prevent the resist repellent layer 4 from being formed on a surface of the uneven pattern 1b. When the resist repellent layer 4 is formed on the uneven pattern 1b, the uneven pattern 1b repels the resist 3. Thus, there is a risk that a shape of the resist pattern 3a deforms.

According to the present embodiment, as illustrated in FIG. 2, when the resist repellent layer 4 is formed on the side surface of the template 1, a shielding plate 5 protects a surface including the uneven pattern 1b formed thereon (uneven pattern surface). The shielding plate 5 is disposed apart from and facing the uneven pattern 1b. A distance between the uneven pattern 1b and the shielding plate 5 is set to be, for example, approximately 30 μm. When the distance is excessively away, gas or a solvent, to be described later, used for forming the resist repellent layer 4 on the side surface of the template 1, also intrudes the uneven pattern 1b of the template 1. Therefore, there is a risk that surface treatment (resist repellency) that repels the resist 3 is performed to the uneven pattern 1b. In contrast, the distance between the uneven pattern 1b and the shielding plate 5 is excessively close, in some cases, the shielding plate 5 comes close to the uneven pattern 1b and then the uneven pattern 1b is destroyed.

A material of the shielding plate 5 is not particularly limited, and, for example, a quartz plate is used. A material of a base member of the template 1 is also not particularly limited, and, for example, quartz glass is used.

The template 1 and the shielding plate 5 are housed in a chamber. With the predetermined degree of vacuum at a predetermined temperature, CF based gas 6 containing carbon and fluorine (for example, $CF_4$, $C_2F_6$, or CHF) is supplied and plasma excitation or thermal excitation is performed. Accordingly, the resist repellent layer 4 with uniform layer thickness is formed on the side surface of the template 1. The resist repellent layer 4 is a fluorocarbon layer containing carbon and fluorine.

Alternatively, a CF based solvent containing carbon and fluorine is introduced into the chamber, and vaporization is performed. Then, the resist repellent layer 4 including a fluorocarbon layer may be formed on the side surface of the template 1.

When the imprinting process is repeated using the template 1 formed by the above method, there is a risk that, after a while, the resist repellent layer 4 is detached from the side surface of the template 1. Note that, even when the resist repellent layer 4 is detached, a resist repellent layer 4 can be formed on the side surface of the template 1 again by the above method. As a result, durability of the template 1 can be improved.

As described above, according to the first embodiment, in a state where the shielding plate 5 is disposed adjacent to the uneven pattern 1b of the template 1, the resist repellent layer 4 is formed on the side surface of the template 1 using the CF based gas 6 or the CF based solvent. Therefore, even when the template 1 is pressed to the resist 3, the resist 3 hardly adheres to the side surface of the template 1. An imprinting process using the present template forms a pattern on a semiconductor substrate and then a semiconductor apparatus is manufactured. Therefore, a defect occurrence frequency can be reduced in semiconductor manufacturing. Note that, according to the present embodiment, the fluorocarbon layer has been applied as the resist repellent layer 4. The present embodiment is not limited to this. A film having a contact angle higher with respect to the resist than that with respect to, for example, quartz that is the material of the side surface of the mesa portion of the template, may be used.

Second Embodiment

In the above first embodiment, since there is a gap between the uneven pattern 1b of the template 1 and the shielding plate 5, there is a risk that the CF based gas 6 or the CF based solvent intrudes around the uneven pattern 1b and then at least a part of the uneven pattern 1b becomes resist repellent. In a second embodiment to be described below, an uneven pattern 1b and a mask member are contacted with each other without destroying the uneven pattern 1b.

Figure 3A:
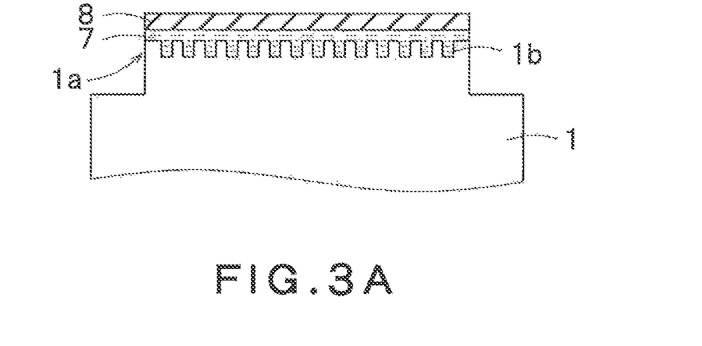
FIG. 3A is a cross-sectional view of a process for describing a method for manufacturing an imprinting template according to a second embodiment.
Figure 3B:
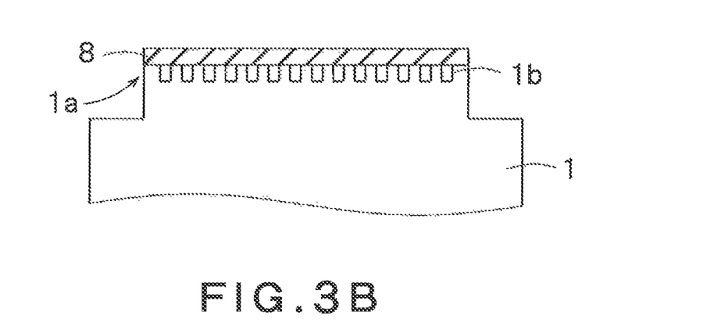
FIG. 3B is a cross-sectional view of a process following the process illustrated in FIG. 3A.
Figure 3C:
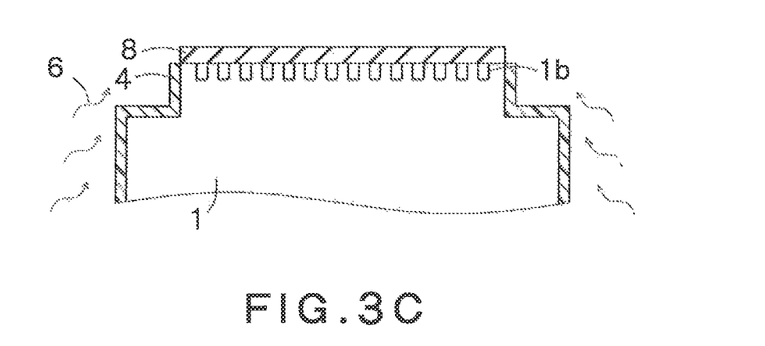
FIG. 3C is a cross-sectional view of a process following the process illustrated in FIG. 3B.

FIGS. 3A to 3C are cross-sectional views of processes for describing a method for manufacturing an imprinting template 1 according to the second embodiment. First, as illustrated in FIG. 3A, a predetermined cushioning member 7 is contacted with an upper surface of the uneven pattern 1b of the template 1. Then, the mask member 8 is disposed on the predetermined cushioning member 7. That is, a first main surface of the cushioning member 7 is contacted with the upper surface of the uneven pattern 1b. A second main surface on the opposite side of the first main surface of the cushioning member 7 is contacted with the mask member 8. The mask member 8 includes, for example, a quartz plate.

Here, the cushioning member 7 includes liquid, such as water, alcohol, or thinner, or a gel member. The cushioning member 7 includes, for example, a member that gradually disappears as pressure decreases around the cushioning member 7, or a member that disappears in accordance with a supply of specified gas when the specified gas is supplied. The cushioning member 7 may be a volatile member that gradually disappears as time passes, or a member that gradually evaporates in accordance with a degree of temperature increase.

As described above, a specific material of the cushioning member 7 is not particularly limited. The cushioning member 7 gradually disappears by temperature control, pressure control, or as time passes. Therefore, a distance between the uneven pattern 1b and the mask member 8 comes close as a degree of disappearance of the cushioning member 7 increases. Finally, as illustrated in FIG. 3B, the mask member 8 is contacted with the uneven pattern 1b after all the cushioning member 7 has disappeared.

Since the cushioning member 7 gradually disappears, no impact occurs when the uneven pattern 1b is contacted with the mask member 8. Therefore, even the mask member 8 is contacted with the uneven pattern 1b, the uneven pattern 1b is not destroyed.

After the mask member 8 is contacted with the uneven pattern 1b, next, a resist repellent layer 4 is formed on a side surface of the template 1 using CF based gas 6 or a CF based solvent that contain carbon and fluorine as in the first embodiment.

According to the second embodiment, when the CF based gas 6 or the CF based solvent is supplied around the template 1, since the uneven pattern 1b is perfectly protected by the mask member 8, there is no risk that the CF based gas 6 or the CF based solvent contacts to the uneven pattern 1b. Thus, the uneven pattern 1b can be securely prevented from being resist repellent. Therefore, according to the second embodiment, the uneven pattern 1b can be effectively prevented from being resist repellent, and the resist repellent layer 4 can be formed on the side surface of the template 1.

As described above, according to the second embodiment, the cushioning member 7 is disposed between the uneven pattern 1b and the mask member 8. The cushioning member 7 gradually disappears by, for example, temperature control or pressure control. Thus, the distance between the uneven pattern 1b and the mask member 8 gradually comes close. Finally, the uneven pattern 1b and the mask member 8 are contacted with each other. Accordingly, the mask member 8 can be contacted with the uneven pattern 1b without destroying the uneven pattern 1b. Therefore, after that, when processing is performed for forming the resist repellent layer 4 on the side surface of the template 1, there is no risk that the uneven pattern 1b becomes resist repellent.

Third Embodiment

According to a third embodiment to be described below, an uneven pattern 1b is protected and a resist repellent layer 4 is formed on a side of a template 1 by a method different from that according to the second embodiment.

Figure 4A:
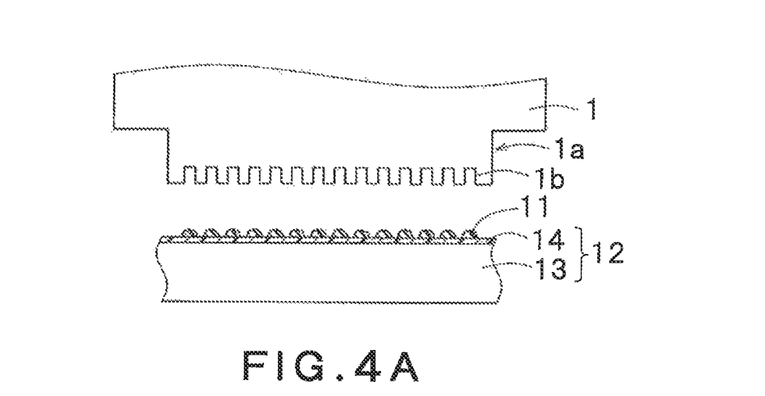
FIG. 4A is a cross-sectional view of a process for describing a method for manufacturing an imprinting template according to a third embodiment.

FIGS. 4A to 4G are cross-sectional views of processes for describing the method for manufacturing the imprinting template 1 according to the third embodiment. First, as illustrated in FIG. 4A, a first substrate 12 including a first member 11 adhering thereto, with predetermined surface free energy, is prepared. The first member 11 includes, for example, resist with surface free energy of 30 to 45 mN/m. The first substrate 12 includes, for example, a Teflon (registered trademark) film 14 disposed on a silicon substrate 13. Surface free energy of the Teflon film 14 is required to be lower than that of the resist, and is, for example, 25 mN/m or less.

Figure 4B:
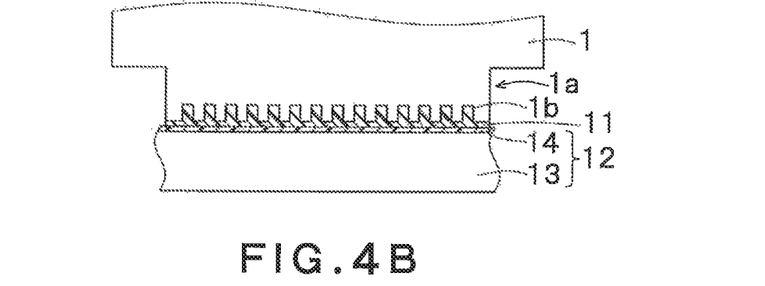
FIG. 4B is a cross-sectional view of a process following the process illustrated in FIG. 4A.
Figure 4C:
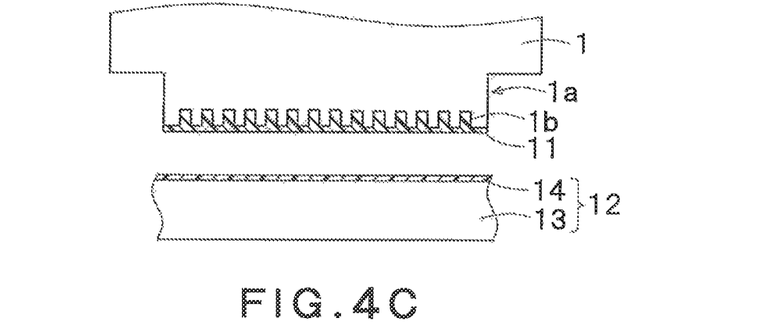
FIG. 4C is a cross-sectional view of a process following the process illustrated in FIG. 4B.

Next, as illustrated in FIG. 4B, the template 1 is pressed to the first substrate 12. Accordingly, the uneven pattern 1b of the template 1 is contacted with the first member 11. The first member 11 enters inside a recess portion of the uneven pattern 1b. A gap inside the recess portion almost disappears. The surface free energy of the Teflon film 14 is 25 mN/m or less and is small. When the template 1 is separated from the first substrate 12, as illustrated in FIG. 4C, the first member 11 is detached from the first substrate 12 and remains adhering to the uneven pattern 1b of the template 1. Accordingly, the uneven pattern 1b is protected by the first member 11.

Figure 4D:
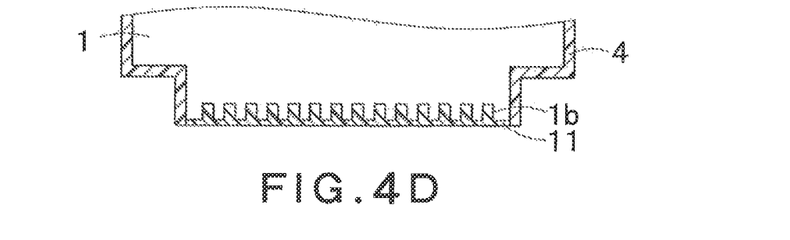
FIG. 4D is a cross-sectional view of a process following the process illustrated in FIG. 4C.

Next, as illustrated in FIG. 4D, a resist repellent layer 4 is formed on the side surface of the template 1 in a state where the first member 11 has adhered to the uneven pattern 1b. Here, as in the first and second embodiments, plasma excitation or thermal excitation is performed to CF based gas 6 containing carbon and fluorine so as to form the resist repellent layer 4. Alternatively, vaporization may be performed to a CF based solvent containing carbon and fluorine. Then, the resist repellent layer 4 may be formed. Since the uneven pattern 1b has been protected by the first member 11, there is no risk that the uneven pattern 1b becomes resist repellent.

Figure 4E:
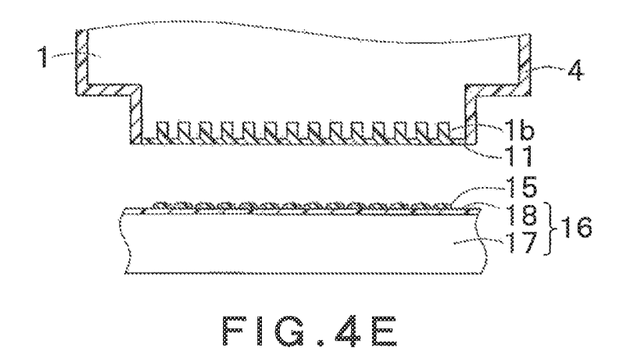
FIG. 4E is a cross-sectional view of a process following the process illustrated in FIG. 4D.

Next, as illustrated in FIG. 4E, a second substrate 16 that includes a second member 15 adhering thereto and has surface free energy larger than that of the second member 15, is prepared. For example, the first member 11 and the second member 15 are substantially the same resist having surface free energy of 30 to 45 mN/m. The second substrate 16 includes, for example, a spin-on-glass (SOG) film 18 having surface free energy of 55 mN/m or more, disposed on a silicon substrate 17. As described above, the surface free energy of the SOG film 18 is required to be larger than that of the second member 15 to be adhered to the SOG film 18.

Figure 4F:
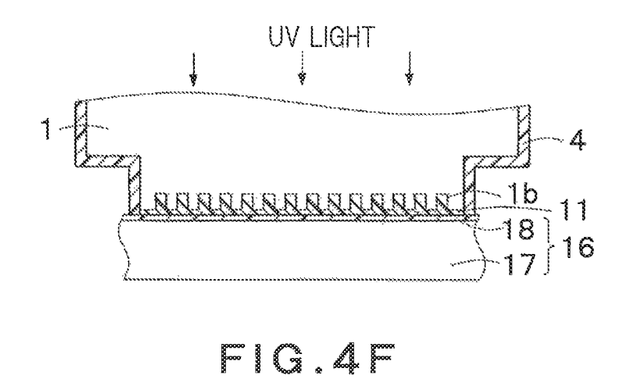
FIG. 4F is a cross-sectional view of a process following the process illustrated in FIG. 4E.
Figure 4G:
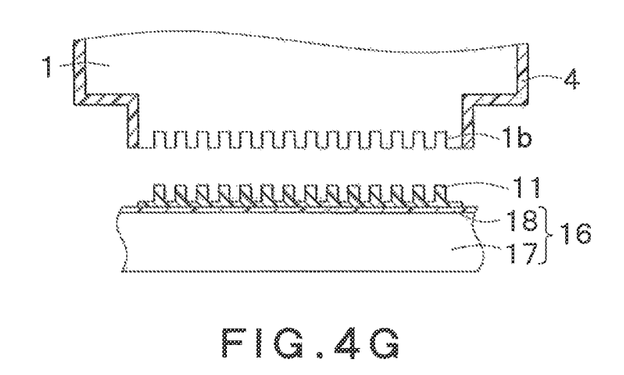
FIG. 4G is a cross-sectional view of a process following the process illustrated in FIG. 4F.

Next, as illustrated in FIG. 4F, the template 1 is pressed to the second substrate 16. Accordingly, the uneven pattern 1b of the template 1 is contacted with the second member 15. The second member 15 is contacted with the first member 11 that has adhered to the uneven pattern 1b. In this state, ultra violet (UV) light is irradiated with respect to a surface on the opposite side of a formed surface of the uneven pattern 1b of the template 1. A release layer is formed on a surface of the first member 11 that has adhered to the uneven pattern 1b. The first member 11 contracts due to the irradiation of the UV light. Accordingly, as illustrated in FIG. 4G, the first member 11 is detached from the template 1. A resist pattern 3a is formed on the second substrate 16 in a state where the first member 11 is integrally coupled to the second member 15.

In FIG. 4G, the template 1 from which the first member 11 has been detached, includes the resist repellent layer 4 formed on the side surface thereof. Thus, the template 1 can be reused. Typically, processing is repeated for transferring the uneven pattern 1b of the template 1 to resist 3 on a wafer 2 while a position of the template 1 is moved on the wafer 2. In a case where the resist repellent layer 4 is formed on the side surface of the template 1 upon first transferring processing, the transferring processing can be repeated using the same template 1 unless the resist repellent layer 4 is detached. In a case where the transferring processing is performed using a template 1 including the resist repellent layer 4 previously formed on the side surface thereof, at least the process illustrated in FIG. 4D may be omitted. Alternatively, the processes illustrated in FIGS. 4A to 4D may be omitted. Only processes illustrated in FIGS. 4E to 4G may be performed.

As described above, according to the third embodiment, the processing for forming the resist repellent layer 4 on the side surface of the template 1 is performed in a state where the first member 11 formed on the first substrate 12 has adhered to the uneven pattern 1b of the template 1, the first member 11 having the surface free energy larger than that of the first substrate 12. Next, the uneven pattern 1b of the template 1 is pressed to the second member 15 that has adhered to the second substrate 16, the second member 15 having the surface free energy smaller than that of the second substrate 16 and similar to that of the first member 11. The first member 11 that has adhered to the uneven pattern 1b is separated from the uneven pattern 1b. The first member 11 is integrally coupled to the second member 15 so as to form the resist pattern 3a. Accordingly, resist repellent processing to the side surface of the template 1 can be performed without causing the uneven pattern 1b to be resist repellent. A fault that the resist 3 climbs up the side surface of the template 1, can be prevented.

Fourth Embodiment

According to a fourth embodiment, a first member 11 that has adhered to an uneven pattern 1b can be easily separated from the uneven pattern 1b without irradiating UV light.

FIGS. 5A to 5F are cross-sectional views of processes illustrating manufacturing processes of an imprinting template 1 according to the fourth embodiment. Since a process order according to the fourth embodiment is basically substantially the same as that according to the third embodiment, points of difference will be mainly described below.

Figure 5A:
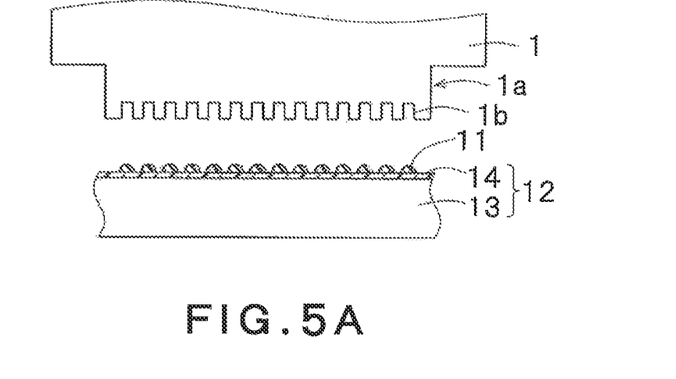
FIG. 5A is a cross-sectional view of a process for describing a method for manufacturing an imprinting template according to a fourth embodiment.
Figure 5B:
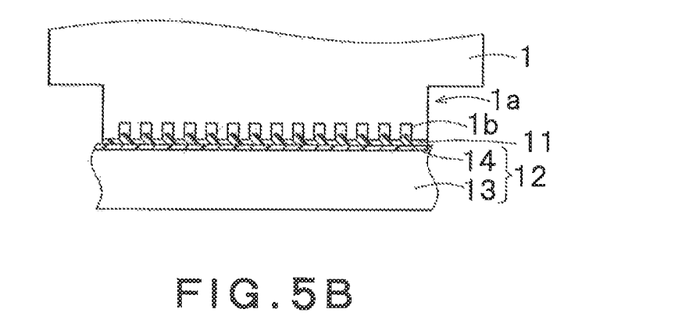
FIG. 5B is a cross-sectional view of a process following the process illustrated in FIG. 5A.
Figure 5C:
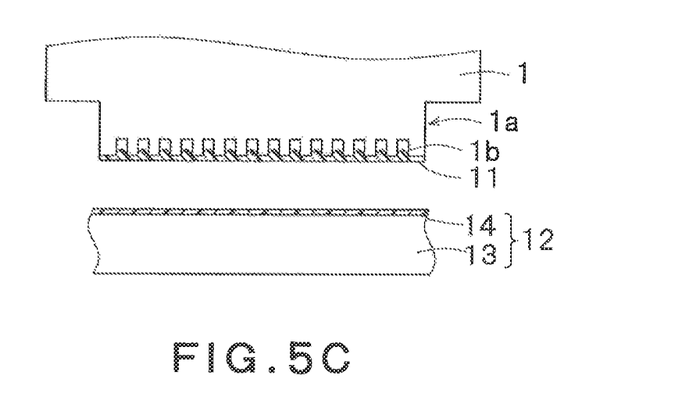
FIG. 5C is a cross-sectional view of a process following the process illustrated in FIG. 5B.
Figure 5D:
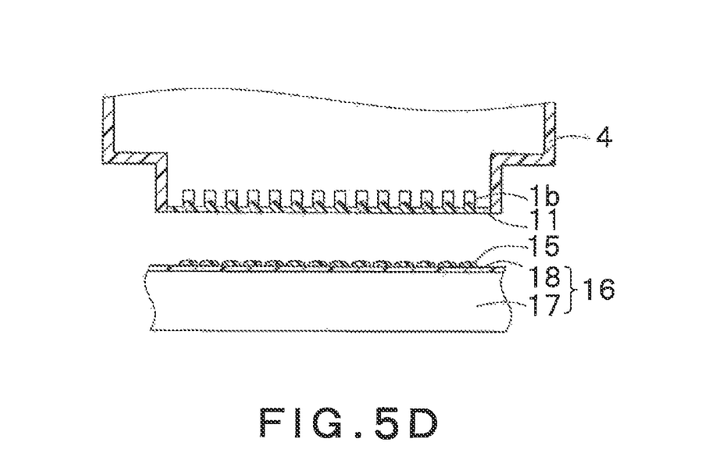
FIG. 5D is a cross-sectional view of a process following the process illustrated in FIG. 5C.
Figure 5E:
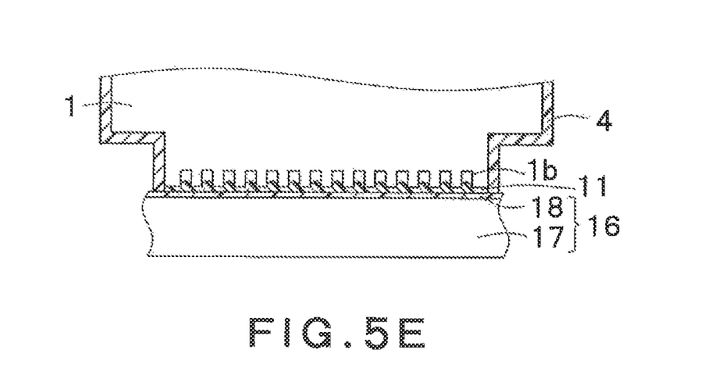
FIG. 5E is a cross-sectional view of a process following the process illustrated in FIG. 5D.
Figure 5F:
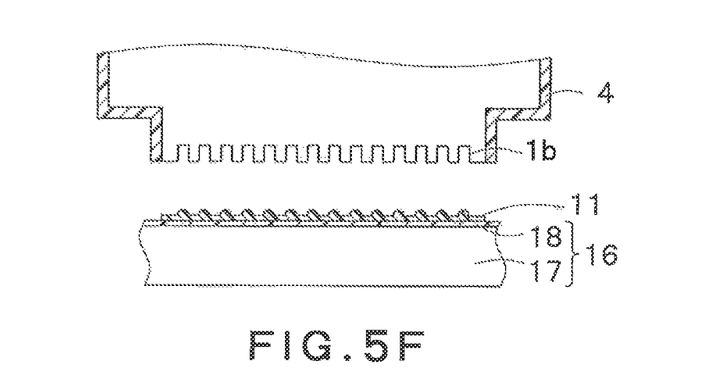
FIG. 5F is a cross-sectional view of a process following the process illustrated in FIG. 5E.

According to the third embodiment, when the template 1 is pressed to the first substrate 12, the first member 11 enters inside the recess portion in order to almost eliminate the gap inside the recess portion of the uneven pattern 1b. According to the fourth embodiment, as illustrated in FIG. 5B, a first member 11 enters a part inside a recess portion. A gap in which there is no first member 11 occurs in the recess portion. The reason for this is because the first member 11 is made to be easily detached from the uneven pattern 1b. That is, as illustrated in FIG. 5E, when the template 1 is pressed to a second substrate 16, there is a gap in each recess portion of the uneven pattern 1b. Thus, the first member 11 is relatively and easily detached from the uneven pattern 1b. Then, the first member 11 is integrally coupled to a second member 15. Therefore, according to the fourth embodiment, there is no need for irradiating the UV light in order to detach the first member 11 from the uneven pattern 1b. When the UV light is irradiated to the template 1, in some cases, there is a risk that a resist repellent layer 4 that has adhered to a side surface of the template 1 is hastened so as to be detached. According to the present embodiment, by detaching the first member 11 from the uneven pattern 1b without irradiating the UV light, it is possible to improve durability of the resist repellent layer 4 that has been formed on the side surface of the template 1.

Note that, a plurality of methods can be considered in order to house the first member 11 in only a part inside the recess portion of the uneven pattern 1b of the template 1 and form the gap inside the recess portion. For example, thrust for pressing the template 1 to the first substrate 12 is adjusted so that an amount of the first member 11 entering inside the recess portion of the uneven pattern 1b can be adjusted. Alternatively, surface free energy of each of the first member 11 and the first substrate 12 may be adjusted. Alternatively, a material is selected so that hardness of the first member 11 may be adjusted.

Accordingly, according to the fourth embodiment, when the template 1 is pressed to the first substrate 12, the first member 11 adheres to the uneven pattern 1b so as to make a gap inside the recess portion in the uneven pattern 1b of the template 1. Accordingly, when the template 1 is pressed to the second substrate 16, the first member 11 is easily detached from the uneven pattern 1b. Thus, there is no need for irradiating the UV light. The durability of the resist repellent layer 4 that has been formed on the side surface of the template 1, can be improved.

Fifth Embodiment

According to a fifth embodiment, there is provided a configuration of a semiconductor manufacturing apparatus for manufacturing a semiconductor apparatus using an imprinting template 1 that has been manufactured according to each of the above third and fourth embodiments.

Figure 6:
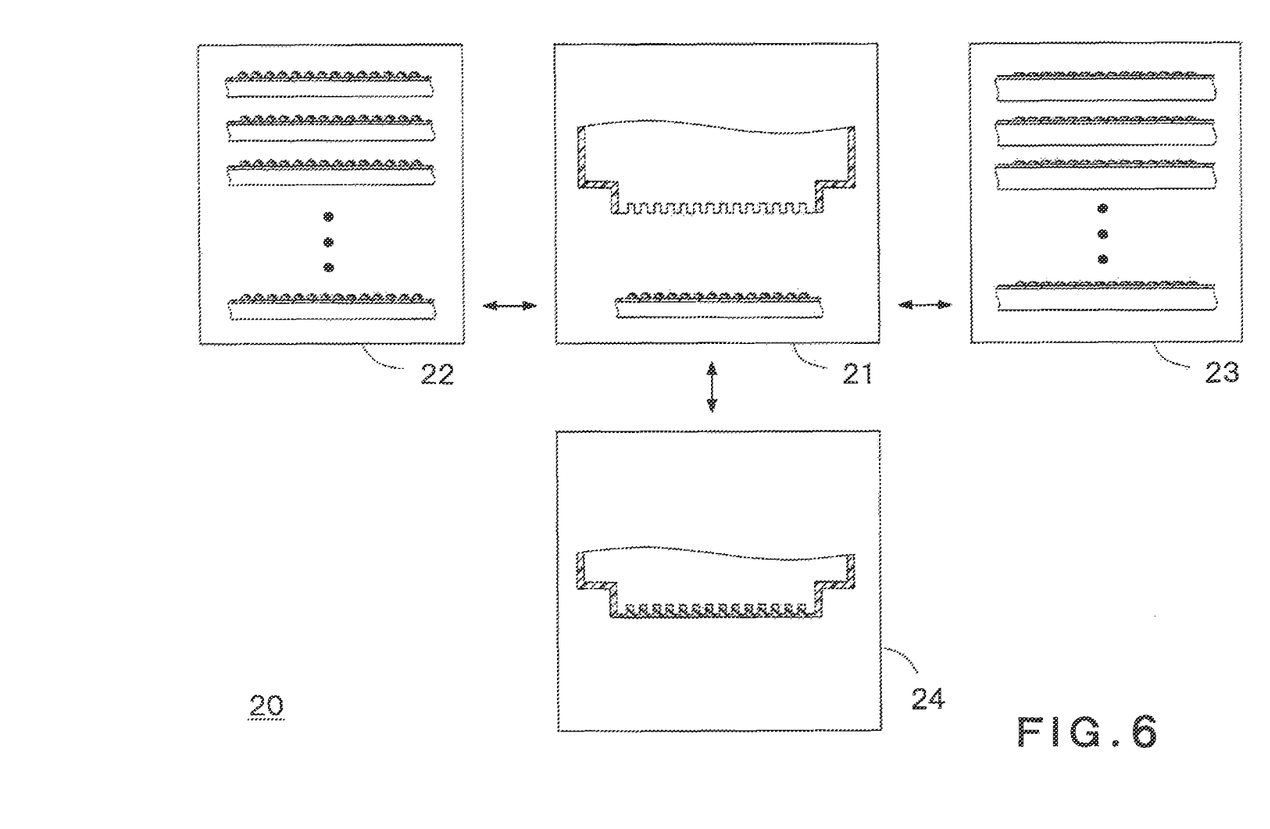
FIG. 6 is a block diagram of a schematic configuration of a semiconductor manufacturing apparatus that achieves manufacturing of the imprinting template according to each of the third and fourth embodiments.

FIG. 6 is a block diagram of a schematic configuration of the semiconductor manufacturing apparatus 20 including manufacturing of the imprinting template 1 according to each of the third and fourth embodiments. In FIG. 6, only configuration parts related to the manufacturing of the template 1 are illustrated and other configuration parts are omitted.

The semiconductor manufacturing apparatus 20 in FIG. 6 includes an imprinting chamber 21, a first housing unit 22, a second housing unit 23, and a plasma processing unit 24. The imprinting chamber 21 is a place where an imprinting process is performed. An imprinting template 1 and a wafer 2 to be an object to which transferring is performed, are introduced in the imprinting chamber 21.

The first housing unit 22 houses a plurality of first substrates 12 each including a first member 11 adhering thereto. The first substrates 12 that have been housed are sequentially conveyed to the imprinting chamber 21. The first housing unit 22 collects the first substrate 12 from which the first member 11 has been removed in the imprinting chamber 21. Then, a first member 11 adheres again to the first substrate 12 that has been collected. The first housing unit 22 houses the first substrate 12.

The second housing unit 23 houses a plurality of second substrates 16 each to which a second member 15 has adhered. The second housing unit 23 sequentially conveys the second substrates 16 that have been housed, to the imprinting chamber 21. The second housing unit 23 collects a second substrate 16 including a resist pattern 3a formed by coupling the first member 11 to the second member 15 in the imprinting chamber 21.

In the imprinting chamber 21, as described in the third and fourth embodiments, the first member 11 adheres to the uneven pattern 1b of the template 1. Then, the template 1 including the first member 11 adhering thereto, is conveyed to a plasma processing unit 24. The plasma processing unit 24 performs plasma excitation to CF based gas 6 so as to form a resist repellent layer 4 on a side surface of the template 1. After that, the plasma processing unit 24 conveys the template 1 including the resist repellent layer 4 formed on the side surface thereof, to the imprinting chamber 21. Note that, in a case where vaporization is performed to a CF based solvent so as to form a resist repellent layer 4 on the side surface of the template 1, vaporization processing unit (not illustrated) may be disposed instead of the plasma processing unit 24.

As described above, according to the fifth embodiment, the first housing unit 22 houses the plurality of first substrates 12 each including the first member 11 adhering thereto. Similarly, the second housing unit 23 houses the plurality of second substrates 16 each including the second member 15 adhering thereto. Accordingly, as an assembly line, an imprinting process can be performed with respect to a plurality of wafers 2. Therefore, throughput can be improved.

EXAMPLES

Example 1

Quartz glass 15 centimeter-square including an uneven pattern surface as an imprinting template 1, and a mask member 8 including a quartz plate, were prepared. A main surface of the quartz plate included in the mask member 8 is coated with a Teflon film. The Teflon film is disposed facing the uneven pattern surface. The uneven pattern surface of the quartz glass was wetted with water. The mask member 8 was disposed on the uneven pattern surface that has been wetted. In this case, the water was a cushioning member 7. Weak thrust pressed the mask member 8 from a surface on the opposite side of the Teflon film of the mask member 8 toward the uneven pattern surface. Accordingly, the water gradually extruded from a gap between the uneven pattern surface and the mask member 8. As a result, the gap between the uneven pattern surface and the mask member 8 was gradually shortened. Finally, the mask member 8 was contacted with the uneven pattern surface. No impact occurred upon the contact. After that, fluorine surface treatment was performed to a surface of the quartz glass other than the uneven pattern surface. In the fluorine surface treatment, plasma excitation was performed to CF based gas 6 containing carbon and fluorine. A resist repellent layer 4 containing carbon and fluorine was formed on the surface of the quartz glass.

After that, water was introduced into the gap between the uneven pattern surface and the mask member 8 again. A distance between the uneven pattern surface and the mask member 8 was gradually widened. Then, the mask member 8 was removed from the uneven pattern surface. The uneven pattern surface of the quartz glass was examined by a defect inspection apparatus. No foreign substances and scratches of 0.2 μm or more occurred.

Example 2

Quartz glass 15 centimeter-square including an uneven pattern surface as an imprinting template 1, and a mask member 8 including a quartz plate, were prepared. The mask member 8 disposed facing the uneven pattern surface was a quartz plate. A main surface of the quartz plate was coated with a Teflon film. The Teflon film was disposed facing the uneven pattern surface. The uneven pattern surface of the quartz glass and the Teflon film of the mask member 8 were apart from each other and disposed facing each other. Nitrogen was introduced into a gap between the uneven pattern surface and the Teflon film. In this case, the nitrogen was a cushioning member 7. Weak thrust pressed the mask member 8 from a surface on the opposite side of the Teflon film of the mask member 8 toward the uneven pattern surface. Accordingly, the nitrogen gradually extruded from the gap between the uneven pattern surface and the mask member 8. As a result, the gap between the uneven pattern surface and the mask member 8 was gradually shortened. Finally, the mask member 8 was contacted with the uneven pattern surface. After that, fluorine surface treatment was performed to a surface of the quartz glass other than the uneven pattern surface. In the fluorine surface treatment, plasma excitation was performed to CF based gas 6 containing carbon and fluorine. A resist repellent layer 4 containing carbon and fluorine was formed on the surface of the quartz glass.

After that, nitrogen was introduced into the gap between the uneven pattern surface and the mask member 8 again. A distance between the uneven pattern surface and the mask member 8 was gradually widened. Then, the mask member 8 was removed from the uneven pattern surface. The uneven pattern surface of the quartz glass was examined by a defect inspection apparatus. No foreign substances and scratches of 0.2 μm or more occurred.

Example 3

Quartz glass 15 centimeter-square including an uneven pattern surface as an imprinting template 1, and a mask member 8 including a quartz plate, were prepared. The mask member 8 disposed facing the uneven pattern surface was a quartz plate. A main surface of the quartz plate was coated with a Teflon film. The Teflon film was disposed facing the uneven pattern surface. The uneven pattern surface of the quartz glass was wetted with water. The mask member 8 was disposed on the uneven pattern surface that has been wetted. Weak thrust pressed the mask member 8 from a surface on the opposite side of the Teflon film of the mask member 8 toward the uneven pattern surface. Accordingly, the water gradually extruded from a gap between the uneven pattern surface and the mask member 8. As a result, the gap between the uneven pattern surface and the mask member 8 was gradually shortened. Finally, the mask member 8 was contacted with the uneven pattern surface. After that, fluorine surface treatment was performed to a surface of the quartz glass other than the uneven pattern surface. In the fluorine surface treatment, plasma excitation was performed to CF based gas 6 containing carbon and fluorine. A resist repellent layer 4 containing carbon and fluorine was formed on the surface of the quartz glass.

After that, nitrogen was introduced into the gap between the uneven pattern surface and the mask member 8 again. A distance between the uneven pattern surface and the mask member 8 was gradually widened. Then, the mask member 8 was removed from the uneven pattern surface. The uneven pattern surface of the quartz glass was examined by a defect inspection apparatus. No foreign substances and scratches of 0.2 μm or more occurred.

Example 4

Quartz glass 15 centimeter-square including an uneven pattern surface as an imprinting template 1, and a mask member 8 including a quartz plate, were prepared. The mask member 8 disposed facing the uneven pattern surface was a quartz plate. A main surface of the quartz plate was coated with a Teflon film. The Teflon film was disposed facing the uneven pattern surface. The uneven pattern surface of the quartz glass and the Teflon film of the mask member 8 were apart from each other and disposed facing each other. Nitrogen was introduced into a gap between the uneven pattern surface and the Teflon film. Weak thrust pressed the mask member 8 from a surface on the opposite side of the Teflon film of the mask member 8 toward the uneven pattern surface. Accordingly, the nitrogen gradually extruded from the gap between the uneven pattern surface and the mask member 8. As a result, the gap between the uneven pattern surface and the mask member 8 was gradually shortened. Finally, the mask member 8 was contacted with the uneven pattern surface. After that, fluorine surface treatment was performed to a surface of the quartz glass other than the uneven pattern surface. In the fluorine surface treatment, plasma excitation was performed to CF based gas 6 containing carbon and fluorine. A resist repellent layer 4 containing carbon and fluorine was formed on the surface of the quartz glass.

After that, nitrogen was introduced into the gap between the uneven pattern surface and the mask member 8 again. A distance between the uneven pattern surface and the mask member 8 was gradually widened. Then, the mask member 8 was removed from the uneven pattern surface. The uneven pattern surface of the quartz glass was examined by a defect inspection apparatus. No foreign substances and scratches of 0.2 μm or more occurred.

Example 5

Quartz glass 15 centimeter-square including an uneven pattern surface as an imprinting template 1, and a mask member 8 including a quartz plate, were prepared. The mask member 8 disposed facing the uneven pattern surface was a quartz plate. A main surface of the quartz plate was coated with a Teflon film. The Teflon film was disposed facing the uneven pattern surface. The uneven pattern surface of the quartz glass and the Teflon film of the mask member 8 were apart from each other and disposed facing each other. Alcohol was introduced into a gap between the uneven pattern surface and the Teflon film. In this case, the alcohol was a cushioning member 7. Weak thrust pressed the mask member 8 from a surface on the opposite side of the Teflon film of the mask member 8 toward the uneven pattern surface. Accordingly, the alcohol gradually extruded from the gap between the uneven pattern surface and the mask member 8. As a result, the gap between the uneven pattern surface and the mask member 8 was gradually shortened. Finally, the mask member 8 was contacted with the uneven pattern surface. After that, fluorine surface treatment was performed to a surface of the quartz glass other than the uneven pattern surface. In the fluorine surface treatment, plasma excitation was performed to CF based gas 6 containing carbon and fluorine. A resist repellent layer 4 containing carbon and fluorine was formed on the surface of the quartz glass.

After that, alcohol was introduced into the gap between the uneven pattern surface and the mask member 8 again. A distance between the uneven pattern surface and the mask member 8 was gradually widened. Then, the mask member 8 was removed from the uneven pattern surface. The uneven pattern surface of the quartz glass was examined by a defect inspection apparatus. No foreign substances and scratches of 0.2 μm or more occurred.

Comparative Example 1

Quartz glass 15 centimeter-square including an uneven pattern surface and a mask member 8 including Teflon were prepared. The mask member 8 was directly contacted with the uneven pattern surface. After that, fluorine surface treatment was performed to a surface of the quartz glass other than the uneven pattern surface. The uneven pattern surface of the quartz glass was examined by a defect inspection apparatus. As a result, 500 foreign substances and 48 scratches of 0.2 μm or more were detected.

Example 6

A Teflon substrate having surface free energy of 16 mN/m and a quartz plate having surface free energy of 60 mN/m were prepared as a first substrate 12 and a second substrate 16, respectively. Surface treatment was performed to a side surface of a template 1 in a state where resist 3 (first member 11) on the first substrate 12 had been transferred to an uneven pattern surface of the template 1 including quartz glass. More specifically, vaporization was performed to a CF based solvent. A resist repellent layer 4 containing carbon and fluorine was formed on the side surface of the template 1. Coating of resist 3 (second member 15) on a second substrate 16 was performed by spin coating. When an uneven pattern 1*b* to which the resist 3 had been transferred was pressed to the second substrate 16, the resist 3 that had been contacted with the uneven pattern 1*b* was integrally coupled to the resist 3 on the second substrate 16. The resist 3 was separated from the uneven pattern 1*b*. Coating of resist 3 on the second substrate 16 was also performed by drop shot of the resist 3. Similarly, the resist 3 that had been contacted with the uneven pattern 1*b* was integrally coupled to the resist 3 on the second substrate 16. The resist 3 was separated from the uneven pattern 1*b*. No defect that the resist 3 remained on the uneven pattern 1*b* of the template 1 occurred.

Example 7

A carbon substrate having surface free energy of 25 mN/m and a quartz plate having surface free energy of 60 mN/m were prepared as a first substrate 12 and a second substrate 16, respectively. Surface treatment was performed to a side surface of a template 1 by a method similar to that in Example 6 in a state where resist 3 (first member 11) on the first substrate 12 had been transferred to an uneven pattern surface of the template 1 including quartz glass. Coating of resist 3 (second member 15) on a second substrate 16 was performed by a method similar to that in Example 6. Accordingly, excellent transferring processing was performed as in Example 6.

Example 8

A Teflon substrate having surface free energy of 16 mN/m and a silicon wafer 2 having surface free energy of 60 mN/m were prepared as a first substrate 12 and a second substrate 16, respectively. Surface treatment was performed to a side surface of a template 1 by a method similar to that in Example 6 in a state where resist 3 (first member 11) on the first substrate 12 had been transferred to an uneven pattern surface of the template 1 including quartz glass. Coating of resist 3 (second member 15) on a second substrate 16 was performed by a method similar to that in Example 6. Accordingly, excellent transferring processing was performed as in Example 6.

Example 9

A carbon substrate having surface free energy of 25 mN/m and a silicon wafer 2 having surface free energy of 65 mN/m were prepared as a first substrate 12 and a second substrate 16, respectively. Surface treatment was performed to a side surface of a template 1 by a method similar to that in Example 6 in a state where resist 3 (first member 11) on the first substrate 12 had been transferred to an uneven pattern surface of the template 1 including quartz glass. Coating of resist 3 (second member 15) on a second substrate 16 was performed by a method similar to that in Example 6. Accordingly, excellent transferring processing was performed as in Example 6.

Example 10

A silicon wafer 2 including a film having surface free energy of 25 mN/m formed by vaporization of a CF based solvent, coated thereon, and a silicon wafer 2 including an oxide film having surface free energy of 65 mN/m, were prepared as a first substrate 12 and a second substrate 16, respectively. Surface treatment was performed to a side surface of a template 1 by a method similar to that in Example 6 in a state where resist 3 (first member 11) on the first substrate 12 had been transferred to an uneven pattern surface of the template 1 including quartz glass. Coating of resist 3 (second member 15) on a second substrate 16 was performed by a method similar to that in Example 6, Accordingly, excellent transferring processing was performed as in Example 6.

Comparative Example 2

Teflon substrates each having surface free energy of 16 mN/m were prepared as a first substrate 12 and a second substrate 16. Surface treatment was performed to a side surface of a template 1 by a method similar to that in Example 6 in a state where resist 3 (first member 11) on the first substrate 12 had been transferred to an uneven pattern surface of the template 1 including quartz glass. Coating of resist 3 (second member 15) on a second substrate 16 was performed by a method similar to that in Example 6. Part of the resist 3 that had been transferred to the uneven pattern surface of the template 1 was not coupled to the resist 3 on the second substrate 16. The resist 3 remained on the uneven pattern surface.

Comparative Example 3

Teflon substrates each having surface free energy of 60 mN/m were prepared as a first substrate 12 and a second substrate 16. Resist 3 (first member 11) on the first substrate 12 was attempted to be transferred to an uneven pattern surface of a template 1 including quartz glass. However, part of the resist 3 did not adhere to the uneven pattern surface. A part of the uneven pattern surface was not covered with the resist 3. Accordingly, surface treatment was performed to a side surface of the template 1 by a method similar to that in Example 6. A CF based solvent intrudes into a part of an uneven pattern 1b. The part of the uneven pattern 1b became resist repellent.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method for manufacturing an imprinting template substrate, comprising:
  disposing a mask member facing a main surface of a protruded portion formed on a base portion of the imprinting template substrate, an uneven pattern being formed on the main surface; and
  forming a protective layer on a side surface of the protruded portion of the template substrate and a side surface of the base portion, the protective layer having a contact angle higher with respect to a resist material than a contact angle of the protruded portion with respect to the resist material.

2. The method for manufacturing according to claim 1, wherein the protective layer contains carbon and fluorine on the side surface of the protruded portion of the template including quartz.

3. The method for manufacturing according to claim 1, further comprising:
  contacting a first main surface of a predetermined cushioning member with the main surface of the protruded portion of the template;
  contacting the mask member with a second main surface on an opposite side of the first main surface of the cushioning member; and
  shortening gradually a distance between the main surface of the protruded portion and the mask member by gradually removing the cushioning member,
  wherein the forming of the protective layer is performed in a state where the mask is contacted with the main surface of the protruded portion.

4. A method for manufacturing an imprinting template substrate, comprising:
  transferring a first member adhering to a first substrate to a main surface of a protruded portion formed on a base portion of the imprinting template substrate by disposing the first member facing the main surface, contacting the main surface with the first member, pressing the main surface to the first member, and detaching the first member from the first substrate, an uneven pattern being formed on the main surface;
  forming a protective layer on a side surface of the protruded portion of the template substrate and a side surface of the base portion in a state where the first member has been transferred to the main surface, the protective layer including carbon and fluorine; and
  transferring the first member to an upper surface of a second member adhering to a second substrate by disposing the second member facing the main surface to which the first member has been transferred, contacting the main surface with the second member, pressing the main surface to the second member, and detaching the first member from the main surface.

5. The method for manufacturing according to claim 4, wherein the first member has surface free energy smaller than surface free energy of the first substrate, and
  the second member has surface free energy larger than surface free energy of the second substrate.

6. The method for manufacturing according to claim 4, wherein, the forming of the protective layer forms the protective layer by plasma excitation or thermal excitation of CF based gas including carbon and fluorine, or vaporization of a CF based solvent including carbon and fluorine.

7. A method for manufacturing a semiconductor apparatus, comprising transferring an uneven pattern to a protruded portion formed on a base portion of a semiconductor substrate by using an imprinting template including a pattern formed portion and a protective layer, the pattern formed portion including the uneven pattern formed on a main surface, the protective layer being formed on a side surface of the pattern formed portion and a side surface of the base portion, the protective layer having a contact angle higher with respect to a resist material than a contact angle of the pattern formed portion with respect to the resist material.

8. The method for manufacturing according to claim 7, wherein the material of the pattern formed portion is quartz.

9. The method for manufacturing according to claim 7, wherein the protective layer is a layer containing carbon and fluorine.

* * * * *